United States Patent [19]
Graves, Jr.

[11] Patent Number: 4,558,388
[45] Date of Patent: Dec. 10, 1985

[54] SUBSTRATE AND SUBSTRATE HOLDER

[75] Inventor: Walter E. Graves, Jr., San Jose, Calif.

[73] Assignee: Varian Associates, Inc., Palo Alto, Calif.

[21] Appl. No.: 548,124

[22] Filed: Nov. 2, 1983

[51] Int. Cl.⁴ .......................... G11B 5/82; B05D 3/00; B05D 5/12

[52] U.S. Cl. ..................................... 360/135; 118/50; 118/728; 118/724; 204/192 R; 204/298; 427/128; 427/132; 427/209; 427/294

[58] Field of Search .................... 118/50, 724, 728; 198/339, 345; 204/192 R, 298; 294/99 R; 414/217, 222, 225, 416, 417; 360/135, 133; 427/128, 130, 132, 294, 209

[56] References Cited

U.S. PATENT DOCUMENTS

| | | | |
|---|---|---|---|
| 1,229,428 | 6/1917 | Fabritius | 118/503 |
| 1,945,572 | 2/1934 | Sandbrook | 91/60 |
| 2,349,908 | 5/1944 | La Motte | 204/297 |
| 3,396,696 | 8/1968 | Becker | 118/49 |
| 3,516,386 | 6/1970 | Landwehr et al. | 118/49 |
| 3,808,079 | 4/1974 | Akashi et al. | 360/135 X |
| 3,874,525 | 4/1975 | Hassan et al. | 118/49 X |
| 4,311,427 | 1/1982 | Coad et al. | 414/217 |

OTHER PUBLICATIONS

U.S. application Ser. No. 515,247; Boys; Donald R. et al., *Disk or Wafer Handling and Coating System*, filed 07/19/83.

Primary Examiner—Michael R. Lusignan
Attorney, Agent, or Firm—Stanley Z. Cole; Leon F. Herbert

[57] ABSTRACT

A substrate having two parallel planar faces and an edge with a groove is simultaneously coated on both sides in a vacuum chamber. The substrate is raised, lowered and held on edge while the parallel faces are vertically disposed by a blade inserted into the groove so that while the substrate is coated an unobstructed path exists for the coating material to the faces.

6 Claims, 10 Drawing Figures

SUBSTRATE AND SUBSTRATE HOLDER

TECHNICAL FIELD

The present invention relates generally to a method of and apparatus for coating and/or otherwise processing a substrate and more particularly to such apparatus and method wherein a substrate having a peripheral edge which is customarily flat or convex is made with a groove in such edge whereby the substrate is held by a blade engaging said groove in the edge of the substrate. The invention also relates to a substrate having such grooved edge and to a coated substrate having such a grooved edge.

BACKGROUND ART

Certain substrates are desirably coated in a vacuum simultaneously on both planar faces of the substrate. In particular, Winchester or other hard magnetic discs are formed by simultaneously vacuum sputtering magnetic material onto opposite planar faces of a non-magnetic substrate. It is known that it is desirable to hold such a disc vertically during the coating operation to minimize the problem of particulates settling on the disc surface; the particulates have a tendency to be generated in a vacuum sputtering system.

One prior art structure for holding substrates on edge is disclosed in commonly assigned Coad, et al, U.S. Pat. No. 4,311,427, issued Jan. 19, 1982. In the patent, a substrate disc is held on edge by engaging a vertically extending groove in a lifting blade. The blade is raised so that the groove of the blade engages an edge of the substrate, while the substrate is in a holder. The blade then raises the substrate, while holding the substrate on edge. In a prior proposal for using the lifting blade structure of the patent, a magnetic disc substrate is lifted by the blade to a position where the substrate parallel faces are simultaneously coated with magnetic material. During the coating operation, the substrate rests in the groove in the blade, so that a small portion of the substrate is shadowed or obscured from the coating material. Thereby, this small portion of the substrate remains uncoated, which has been perceived as a problem in manufacturing hard magnetic discs because every square millimeter of the disc is desirably employed to enable the maximum amount of data to be loaded into the disc. After the substrate has been coated, it is lowered from the coating position by retracting the blade downwardly. The substrate returns to the holder, thence it is transported to another area, such as another coating station in the vacuum, or to an unloading vacuum lock station.

It is, accordingly, an object of the present invention to provide a new and improved apparatus for and method of coating substrates in a vacuum wherein the substrates are so supported that during the coating operation no portion of the holding structure provides any obstruction between the face of the substrate being coated and the source of the coating material which is deposited on said face.

Another object of the present invention is to provide a new and improved apparatus for and method of simultaneously coating opposite faces of a non-magnetic disc shaped substrate held on edge during the coating operation so that the parallel faces of the substrate are vertically oriented, wherein the substrate is coated completely to the edges thereof with magnetic material.

Another object of the present invention is to provide a new and improved apparatus for and method of supporting a thin, generally circular substrate having opposite faces, and wherein the holding means does not contact or cover any portion of said faces.

Another object of the present invention is to provide a substrate particularly adapted to be supported such that coating material can be deposited onto one or both faces of the substrate to the edges thereof.

It is another object of the present invention to provide a coated substrate formed by mounting parallel, planar faces of the substrate in a vertical plane while the faces are simultaneously coated and wherein material is deposited onto the faces to the edges thereof.

DISCLOSURE OF INVENTION

In accordance with one aspect of the invention, parallel opposite faces of a substrate are simultaneously coated in vacuo by holding the substrate on edge in a vertical plane during the in vacuo coating by inserting a blade in a groove in the edge. The blade, edge and groove are such that no portion of the faces is covered by any holding structure and no obstruction is provided by the holding structure between the faces and source means of the coating material which simultaneously coats the parallel opposite faces. Thereby, the problem of particulates settling on the surface of the disc is minimized while enabling both faces to be coated to the edges thereof.

The substrate is held by the blade so the substrate bears down on the blade. The blade, in addition to holding the substrate in situ during the coating operation, is part of a structure for raising and lowering the substrate between a holder and the position where the coating is performed. A single blade is the only object which contacts the substrate while the substrate is raised, lowered and held in situ. In one version the blade is preferably configured as a knife edge having two opposite planar and generally vertical faces and an upper generally horizontally extending edge between the vertical faces. The planar faces are adapted to fit between planar surfaces that define the groove. The generally horizontally extending edge of the blade seats close to or engages a root of the groove between the planar surfaces of the groove. For magnetic discs, the groove, in plan view, has a circular root. The blade in plan view, has an upper edge configured as a segment of a circle having approximately the same radius as the radius of the circular root. The groove and blade having generally triangular, corresponding cross-sections.

In accordance with another aspect of the invention, a new and improved article of manufacture comprises the substrate which is used with the coating apparatus and method. Such a substrate is rigid and has two parallel planar faces and at least one edge with a groove capable of receiving a blade that exclusively holds the substrate while the material is simultaneously coated on the faces in vacuo in such a manner that portions of both faces immediately adjacent the groove can be coated. The article is initially an uncoated disc to be coated to form a magnetic disc and the substrate is non-magnetic. The finished article is a magnetic disc, with the substrate being non-magnetic and coated with magnetic material completely across the faces of the disc.

In another embodiment the groove in the edge of the substrate is engaged by holding means comprising a plurality of blades each engaging the groove in the substrate from a different direction. In such embodiment it is possible to support and/or transport the substrates in either vertical or horizontal orientation, or any other orientation. Also in such embodiment, a plurality of substrates can be supported on a unitary holding structure.

The above and still further objects, features and advantages of the present invention will become apparent upon consideration of the following detailed description of several specific embodiments thereof, especially when taken in conjunction with the accompanying drawings.

BEST MODE FOR CARRYING OUT THE INVENTION

Figure 1:
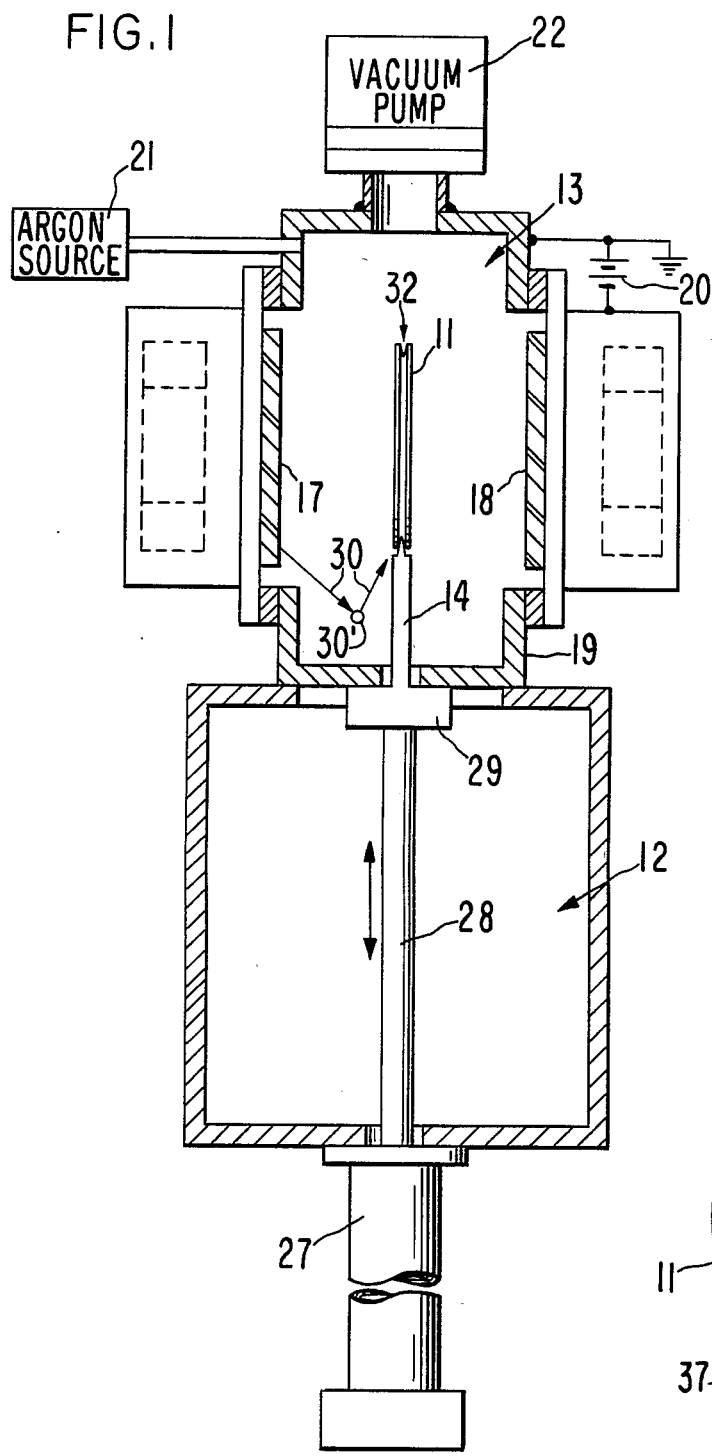
FIG. 1 is a side sectional view of a coating apparatus including in the invention.

The invention is described in combination with a cathode sputtering structure in connection with FIG. 1. It is to be understood, however, that the invention is applicable to other types of vacuum coating systems and is not restricted to cathode sputtering. The invention is also applicable to other types of substrate processing such as sputter etching.

Referring now more particularly to FIG. 1, substrate 11, preferably fabricated as a rigid non-magnetic preferably aluminum disc, is vertically translated by blade 14 between vacuum handling chamber 12 and vacuum sputter coating chamber 13. While substrate 11 is coated, blade 14 holds the substrate on edge so that parallel, planar faces 15 and 16 (FIG. 2) of the substrate are vertically disposed. By positioning substrate 11 so that faces 15 and 16 are vertically disposed, settling of particulates, having a tendency to be generated in vacuum chamber 13 during the sputtering operation, is minimized so that surfaces 15 and 16 remain relatively free of contaminants.

Faces 15 and 16 are simultaneously coated with material emitted from targets 17 and 18 which are disposed in chamber 13 so that the targets respectively face faces 15 and 16. To provide the sputtering effect, targets 17 and 18 form part of a cathode electrode. When it is desired to coat disc 11 to form a magnetic disc of the type employed in computers, targets 17 and 18 are fabricated of a magnetic material which, when deposited on substrate 11, is capable of storing magnetic information. To provide a cathode sputtering plasma between targets 17 and 18 and substrate 11, envelope 19 of chamber 13 serves as an anode electrode. DC source 20 maintains targets 17 and 18 at a relatively high, negative DC voltage, while metal envelope 19 is grounded. An inert gas, typically argon, is supplied from a suitable source 21 to the interior of chamber 13, that is evacuated by vacuum source 22.

After the coating process has been completed, blade 14 is lowered, to return substrate 11 to handling chamber 12. After substrate 11 has been returned to handling chamber 12, it is removed from blade 14 and transported, by suitable means (not shown) to another vacuum coating station or to an unloading vacuum lock station. The entire time while substrate 11 is held by blade 14, the substrate is held on edge, so that faces 15 and 16 are vertically disposed.

To raise and lower blade 14 and substrate 11 and maintain the blade and substrate in situ during the coating operation, actuating cylinder 27, preferably driven by a pneumatic source, is provided. Cylinder 27 drives piston 28, having an upper horizontal face to which platform 29 is secured. Platform 29 carries blade 14.

To enable faces 15 and 16 to be coated to peripheral edge 31 (FIG. 3) thereof, completely across the 360° face of the substrate, the edge 31 includes groove 32. Groove 32 is concentric with and extends completely around peripheral edge 31.

Groove 32 has a generally triangular cross-section (FIG. 2), with generally vertical, slightly sloping planar surfaces 33 and 34 that meet at root 32' of groove 32. Root 32', at the intersection of surfaces 33 and 34, is rounded to facilitate manufacture of groove 32. The angle between surfaces 33 and 34 is typically 60°. For a typical magnetic disc having a substrate 11 with a thickness between faces 15 and 16 of approximately 1.9 mm, groove 32 has a radial depth of approximately 1.0 mm. The apex of root 32' is equispaced between faces 15 and 16. Groove 32 has an opening in edge 31, between faces 15 and 16, of approximately 1.2 mm. In accordance with the invention it has been found that even though the substrate is relatively thin, there is adequate thickness on both sides of the groove 32 along edge 31 to provide adequate strength between surface 33 and face 15, as well as between face 34 and face 16.

Figure 2:
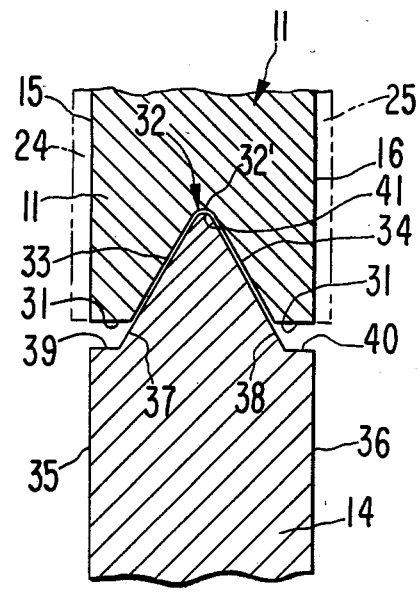
FIG. 2 is a side sectional, enlarged view of a portion of the structure illustrated in FIG. 1.

As illustrated in FIG. 2, blade 14 is configured so that the tip thereof corresponds in cross-sectional shape with the cross-sectional shape of groove 32. Blade 14 includes parallel, vertically extending faces 35 and 36, which extend upwardly from platform 29. At the upper ends of faces 35 and 36, horizontal shoulders 39 and 40 are provided. From the inner edges of shoulders 39 and 40 are upwardly extending knife edge segments 37 and 38 that are tapered toward each other so as to have a shape corresponding with surfaces 33 and 34. The dimensions and shape of edges 37 and 38 are such that the edges can fit into groove 32 between surfaces 33 and 34. Edges 37 and 38 are rounded at the ends thereof to define a circular edge 41 which enters the groove. Circular edge 41 has a radius (in side view, FIG. 3) slightly larger than, but approximating the radius of root 32' so that edge 41 seats close to or engages root 35. Edge 41 has an approximately 90° angular extent (in side view), so that one quarter of the peripheral area of substrate 11 bears against edge 41 to provide substantial contact area between substrate 11 and blade 14. The angular extent of edge 41 could be more or less than 90° but preferably not more than 180° so as not to project outwardly beyond the diameter of the substrate.

In sputter coating, sputtering particles leave the target in all directions. Thus, if targets 17 and 18 have a larger diameter than the substrate, some of the material being deposited on faces 15 and 16 will come along a trajectory outside of and directed toward the periphery of the substrate. This effect is compounded by the fact that some of the sputtered particles are deflected by gas atoms in the coating chamber. This is shown in FIG. 1 by trajectory lines 30 for a sputtered particle which collides with gas atom 30'. To prevent a shadow effect and assure that sputtered coating material is deposited on faces 15 and 16 all the way to edge 31, it is important that blade 14 have no portion thereof (as viewed in FIG. 2) which is wider than the uncoated substrate 11 and located in close proximity to substrate edge 31. If for strength reasons blade 14 must be wider than shown in FIG. 2, shoulders 39 and 40 are provided so tapered sides 37 and 38 begin at a position sufficiently below edge 31 to avoid shadowing when the blade is supporting the substrate 11. Thus, sides 37 and 38 are sufficiently long so that when blade 14 extends completely into groove 32, shoulders 39 and 40 are spaced from edge 31.

When groove 32 extends 360° around the periphery of edge 31, substrate 11 is orientation insensitive. In other words, it is not necessary for substrate 11 to have any particular angular orientation when it is engaged by blade 14. Because there are no obstructions between targets 17 and 18 or the coating material generated thereby and faces 15 and 16, coatings 24 and 25 are deposited across the faces of substrate 11, completely to edge 31, and the thicknesses of coatings 24 and 25 at edge 31 can be the same as the thicknesses of the coatings at other portions of substrate 11 where coating material is deposited.

Although a continuously circular groove is preferable from the standpoint of ease of manufacture and the ability of the blade to engage the substrate in any circular orientation thereof, other groove versions are possible. For example, the groove 32 can extend along only an edge portion of the substrate which forms a circular arc slightly larger than the width of blade 14 as viewed in FIG. 3. Also, the center portion of the upper edge of blade 14 (as viewed in FIG. 3) can be recessed downwardly (for example across the center one third of the total width of the blade) so as not to engage the substrate when the substrate is supported by the two upwardly projecting outer portions of the blade. The important consideration is that the blade engage the substrate at two locations on opposite sides of the vertical diameter of the substrate and significantly above the bottom of the substrate to hold the substrate against tilting. In such an arrangement the substrate can have two spaced groove portions to receive the two spaced outer projections on the blade.

Figure 3:
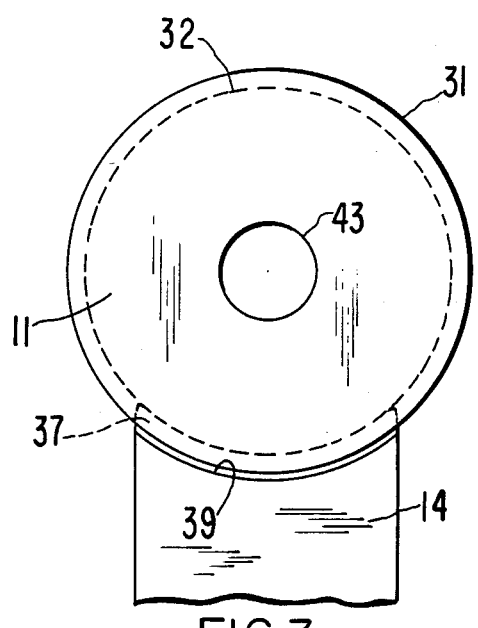
FIG. 3 is a front view of a substrate in accordance with the invention in combination with a substrate holding structure in accordance with the invention.

Hard magnetic disc substrates such as disc 11 are normally made with a centrally located hole as shown at 43 in FIG. 3. The outside diameter of the discs ranges from about 50 mm to about 355 mm.

Reference is now made to FIGS. 4–7 wherein alternate configurations for blade 14 and groove 32 are illustrated. In all of the alternate configurations, the blade has side walls that extend into groove 32 such that the wall length is sufficiently great to preclude shadowing of faces 15 and 16. In each of the configurations, groove 32 preferably has a depth of approximately 1.0 mm and extends completely around the periphery of edge 31.

Figure 4:
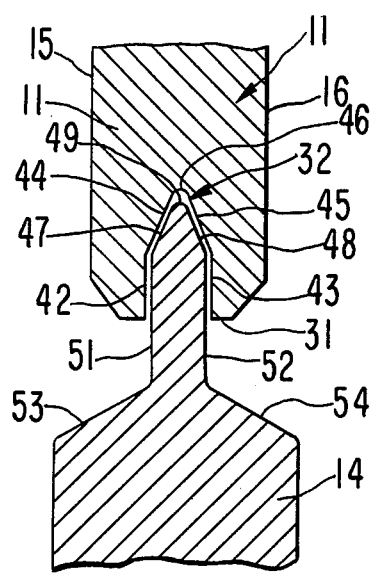
FIGS. 4, 5, 6 and 7 are side sectional, enlarged views of four additional embodiments of the invention.

In the configuration of FIG. 4, groove 32 has a cross-section similar to that of a pentagon, including walls 42 and 43, both of which are parallel to each other and faces 15 and 16. Parallel walls 42 and 43 intersect sloping walls 44 and 45, respectively. Walls 44 and 45 intersect at circular cross-sectioned root 46 of groove 32. The angle between walls 44 and 45 is approximately 45°, a result achieved because of the geometry wherein walls 42 and 43 extend approximately 0.5 mm radially into substrate 11.

The end of blade 14 which engages groove 32 to support and hold substrate 11 has a pentagonal shape including sloping end walls 47 and 48, each of which is approximately as long as walls 44 and 45; walls 47 and 48 are joined together by rounded tip 49, which conforms with rounded root 46. Sloping walls 47 and 48 extend from parallel walls 51 and 52, having a length approximately twice the length of walls 42 and 43. Thereby, walls 51 and 52 extend from sloping shoulders 53 and 54, respectively, such that the shoulders are spaced from and do not shadow faces 15 and 16 of disc substrate 11.

Figure 5:
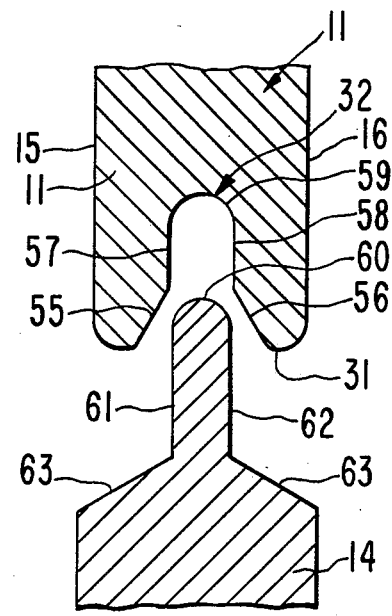

In the configuration of FIG. 5, groove 32 includes sloping walls 55 and 56 which start at edge 31 and taper toward each other as they extend radially toward the center of disc substrate 11. Walls 55 and 56 extend radially of disc 11 for approximately 0.5 mm, at which point they intersect walls 57 and 58, that are parallel with each other and with faces 15 and 16. Walls 57 and 58 extend radially of disc substrate 11 until they intersect circular root segment 59.

The disc substrate 11 of FIG. 5 is supported by a blade including a pair of elongated walls 61 and 62, spaced from each other by slightly less than the spacing between walls 57 and 58. Walls 61 and 62 have a length in excess of the distance between edge 31 and root 59, to preclude a shadow effect on faces 15 and 16. To these ends, walls 61 and 62 extend from sloping shoulders 63 of blade 14. Walls 61 and 62 are connected by a circular tip 60. The relatively wide mouth on edge 31, between sloping walls 55 and 56, allows greater tolerance in the positioning of blade 14 relative to substrate 11 across the width of the substrate between faces 15 and 16 (for insertion of the blade into groove 32).

Figure 6:
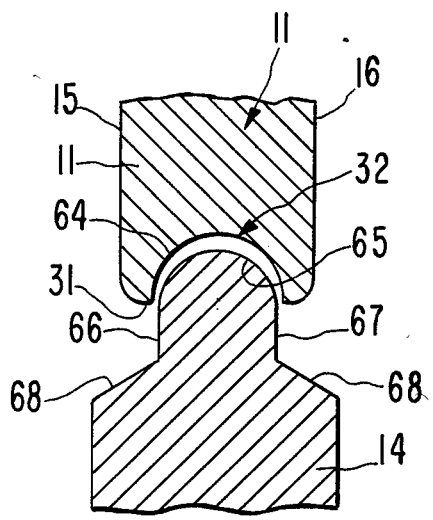

In the embodiment of FIG. 6, groove 32 has a semi-circular cross-section with a perimeter 64 having a diameter on edge 31. The semi-circle has a point of tangency across the width of disc 11 at a point equidistant from faces 15 and 16; similarly, the grooves in all other embodiments are preferably centered between the opposite faces of substrate 11. The semi-circular groove 64 is easier to fabricate than the grooves of the other embodiments but is likely to be less stable in holding the substrate than the other embodiments.

To hold substrate 11 in groove 32 in FIG. 6, blade 14 is configured to have a semi-circular periphery 65, having a radius approximately equal to, but slightly less than, the radius of perimeter 64. Semi-circular perimeter 65 extends from vertically extending walls 66 and 67 at a point of tangency between the semi-circular perimeter and the vertical walls. Walls 66 and 67 have a length sufficient to prevent a shadow effect of material on faces 15 and 16 adjacent edge 31. Walls 66 and 67 extend from shoulders 68.

Figure 7:
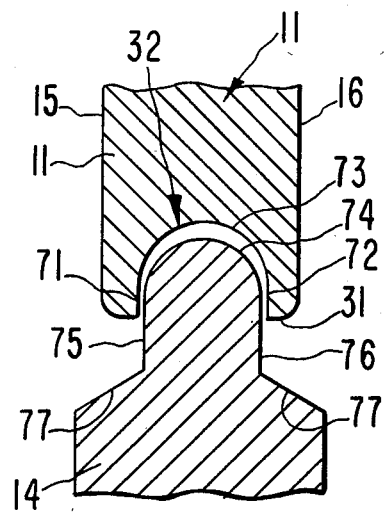

In the blade and groove configuration of FIG. 7, groove 32 is formed as two parallel walls 71 and 72 which extend from edge 31 and are parallel to each other, as well as faces 15 and 16. Walls 71 and 72 extend approximately 0.5 mm radially toward the center of disc 11, at which point they intersect semicircular wall segment 73, where the diameter of the wall segment is such that it intersects walls 71 and 72 diametrically opposite points of tangency.

Blade 14 has an end which conforms roughly with the groove illustrated in FIG. 7. In particular, the end of blade 14 has a cross-section with a semi-circular perimeter 74 having a diameter slightly less than the diameter of peripheral wall segment 73. At the diametrically opposite points of vertical tangency of perimeter 74, the perimeter intersects vertically extending, parallel walls 75 and 76, having a spacing between them slightly less than the spacing between walls 71 and 72. Walls 75 and 76 have a length sufficiently in excess of the length of walls 71 and 72 to preclude casting a shadow on faces 15 and 16 at the intersection thereof with edge 31. Walls 75 and 76 extend from sloping shoulders 77 of blade 14.

In FIGS. 5–7 the tip edge of the blade will engage the root of groove 32 when the substrate is supported vertically on the blade. Such engagement is not required for FIGS. 2, 4 and 10.

In each of the embodiments, standard techniques can be used to form circular groove 32 in edge 31. In particular, substrate 11 can be formed as a cast aluminum or other non-magnetic metal wherein the desired shape is achieved by proper formation of the casting dies. Alternatively, mechanical means, such as saws or mills, can be used to form grooves 32 in edges 31.

Figure 8:
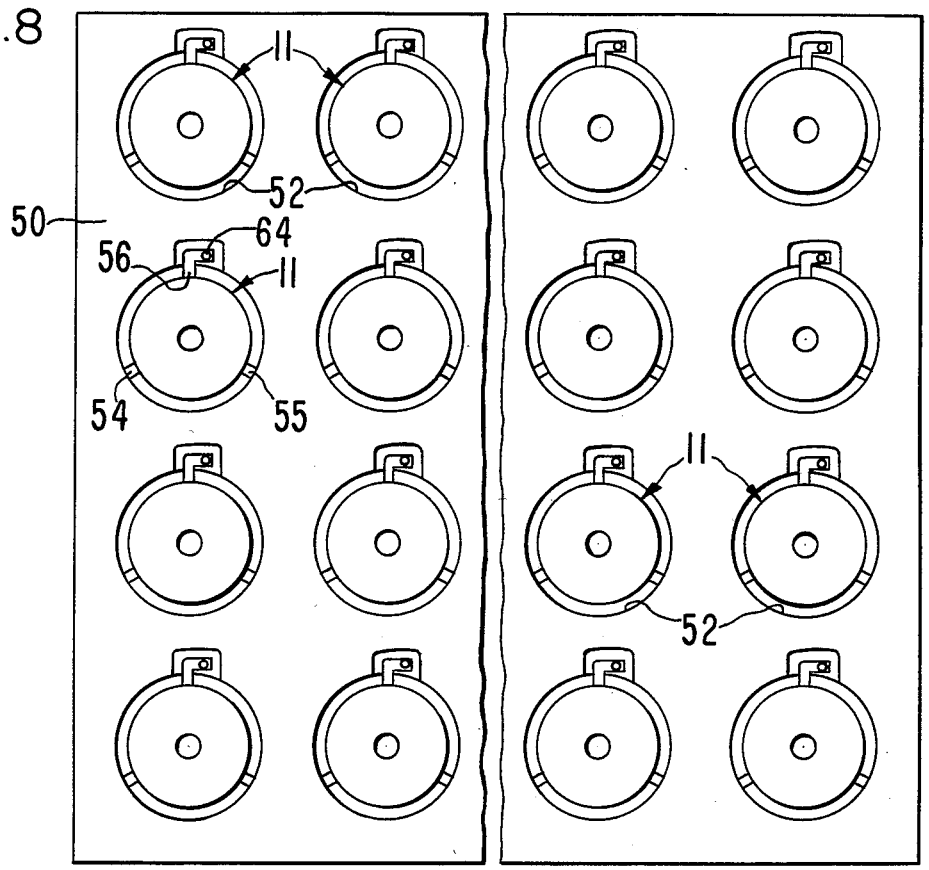
FIG. 8 is a plan view of another embodiment of the apparatus.
Figure 9:
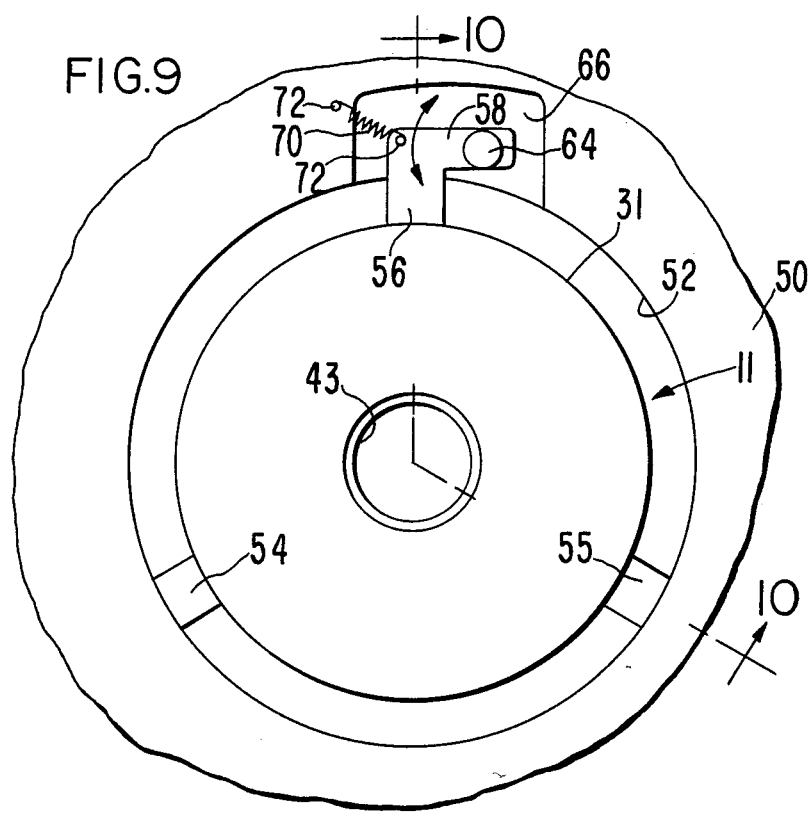
FIG. 9 is an enlarged plan view of a portion of FIG. 8.
Figure 10:
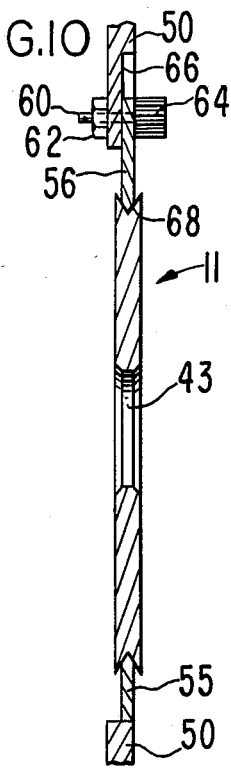
FIG. 10 is a sectional view taken on line 10—10 of FIG. 9.

Another embodiment of the invention is shown in FIGS. 8, 9 and 10. In this embodiment the holding structure is so designed that substrate 11 is held and/or transported by a plurality of supporting blades. The holding structure can support a single substrate, or a plurality of substrates when the holding structure is in the form of an enlarged platen 50 (FIG. 8). Obviously the platen could be of a size to support only one substrate.

As shown in FIGS. 8–10, a support structure such as platen 50 is provided with one or more apertures 52. A plurality of supporting blades 54, 55, and 56 are attached to the platten in spaced fashion around aperture 52. Blades 54 and 55 are stationary and blade 56 is moveable toward and away from edge 31 of the substrate. Blades 54 and 55 are preferably spaced part such that the centerlines through each of them intersect to form at an angle of about 120° or less, but preferably not less than about 90°. Moveable blade 56 is preferably located on the diameter of aperture 52 which bisects the angle between stationary blades 54 and 55. Alternatively, blades 54 and 55 could be replaced by a single stationary blade. In which case the single blade is preferably centered on the same diameter on which moveable blade 56 is centered, and the combined length of circular contact between the substrate and the two blades must be sufficient to hold the substrate securely in a fixed plane.

Movement of blade 56 may be accomplished in verious ways. As shown schematically in enlarged FIGS. 9 and 10, blade 56 has an integral arm 58 which is rigidly attached to a shaft 60 which is received in a bearing bore in platen 50 and is held against axial motion as by nut 62. A knurled turn knob 64 is rigidly attached to arm 58 concentric with the axis of shaft 60. The criteria for the arrangement is that the blade 56 is maintained in a fixed plane as it moves about the axis of shaft 60 during substrate loading and unloading operations. Thus, the arrangement may be such that the arm 58 bears rotatably against recessed wall 66 of the platen, or against an intervening washer, and that nut 62 or equivalent bears rotatably against the opposite wall of the platen and is designed so that after it is threaded onto shaft 60 it is prevented from rotating relative to the shaft during rotation of arm 58 about the axis of the shaft. Also, it is necessary that when arm 58 is rotated to a position in which blade 56 contacts groove 68 (FIG. 10) in the edge of substrate 11, the blade will be prevented from movement out of such contact until it is desired to unload the substrate. As shown schematically in FIG. 9, this can be done by a compression spring 70 having circular ends rotateably supported on pins 72 projecting outwardly from arm 58 and platen 50; the arrangement being such that when arm 58 is in the holding position of FIGS. 9 and 10, the compression force of the spring will maintain blade 56 in contact with groove 68 in the substrate. The arrangement of spring 70 is preferably also such that when arm 58 is rotated clockwise to the retracted position (which enables insertion or removal of the substrate) the spring will cause it to remain there until knob 64 is rotated counterclockwise to move blade 56 back into engagement with a substrate.

The cross-section shape of the groove 68 and the end of each of the blades 54–56 is shown in FIG. 10 as being a knife edge taper for the blades and a matching taper for the groove walls, similar to FIG. 2 but without shoulders 39 and 40. Alternatively, the shape for the groove and blades for the embodiment of FIGS. 8–10 can be the same as any shown in FIGS. 2 and 4–7. In the multi-blade embodiment of FIGS. 8–10, the groove shape of FIG. 6 will not suffer from the instability which may be experienced when used with a single blade.

The substrate-loading procedure for the embodiment of FIGS. 8–10 is that an operator rotates knob 64 to its retracted position in which the inner edge of blade 56 is moved outward far enough for the operator to position a substrate 11 such that blades 54 and 55 are received in groove 68. Then the operator rotates knob 64 to insert blade 56 into the groove. For unloading, the operator turns knob 64 to fully withdraw blade 56 and then removes the substrate from blades 54 and 55. The operator can hold the blade during loading and unloading either by grasping it around hole 43 by placing one finger through the hole and another finger on the opposite face of the substrate, or by grasping the substrate around its periphery. In the later case the aperture 52 must be large enough (or indented) to accomodate the operator's fingers. Alternatively, the operator may use spring type tweezers to grip either the inner or outer periphery of the substrate.

After platen 50 is loaded with one or more substrates, it can be held stationary in, or moved through, a vacuum chamber in vertical, horizontal or other angular orientation so the one or more substrates can be coated from one or more coating sources located on one or both sides of the platen.

If the substrates are to be coated (or otherwise processed) on only one side, or on only one side at a time, the blades 54–56 and the moving mechanism for blade 56 can be mounted on the face of an unapertured platen 50. Such an arrangement would still use the same circular orientation of the blades as shown in FIG. 9, and the same spaced location as shown in FIG. 8 for the various three-blade sets which each hold one substrate.

While there have been described and illustrated several specific embodiments of the invention, it will be clear that variations in the details of the embodiments specifically illustrated and described may be made without departing from the true spirit and scope of the invention as defined in the appended claims.

What is claimed is:

1. A method of simultaneously coating parallel opposite faces of a substrate in vacuo comprising holding the substrate on edge in a vertical plane during the in vacuo coating by inserting a blade in a groove in the edge so that none of the surfaces of the faces is covered by any holding structure and no obstruction is provided by the holding structure between the faces and source means of the coating material.

2. The method of claim 1 wherein the blade holds the substrate so the substrate bears down on the blade.

3. The method of claim 2 wherein the substrate is held only by a single blade.

4. A magnetic disc comprising a substantially rigid substrate of non-magnetic material, said substrate having two parallel planar faces intersecting a peripheral edge, said edge of the substrate having a groove therein whereby the substrate can be supported by contact with the interior surfaces of said groove, said substrate having a coating of magnetic material on each of said faces, and said coating extends to said edge at all locations around the edge.

5. The magnetic disc of claim 4 wherein the groove has a circular root concentric with said peripheral edge.

6. The magnetic disc of claim 4 wherein the groove has a portion thereof which is generally triangular in cross-section.

* * * * *